(12) United States Patent
Oh

(10) Patent No.: US 12,507,550 B2
(45) Date of Patent: Dec. 23, 2025

(54) DISPLAY DEVICE

(71) Applicant: Samsung Display Co., Ltd., Yongin-si (KR)

(72) Inventor: Myong-Soo Oh, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 404 days.

(21) Appl. No.: 17/985,477

(22) Filed: Nov. 11, 2022

(65) Prior Publication Data
US 2023/0217748 A1 Jul. 6, 2023

(30) Foreign Application Priority Data
Jan. 4, 2022 (KR) .................. 10-2022-0000998

(51) Int. Cl.
*H10K 59/12* (2023.01)
*H01L 23/00* (2006.01)
*H10K 59/131* (2023.01)

(52) U.S. Cl.
CPC ........... *H10K 59/131* (2023.02); *H01L 24/05* (2013.01); *H01L 24/06* (2013.01); *H01L 2224/0508* (2013.01); *H01L 2224/05147* (2013.01); *H01L 2224/05166* (2013.01); *H01L 2224/05573* (2013.01); *H01L 2224/05686* (2013.01); *H01L 2224/06051* (2013.01); *H01L 2224/06155* (2013.01); *H01L 2224/06515* (2013.01)

(58) Field of Classification Search
CPC ...... H10K 59/12; H10K 59/131; H01L 24/06; H01L 2224/0508; H01L 2224/06155; H01L 2223/54426
See application file for complete search history.

(56) References Cited

U.S. PATENT DOCUMENTS

| | | |
|---|---|---|
| 9,082,774 B1 * | 7/2015 | Shin ................. H10H 29/142 |
| 10,608,209 B2 | 3/2020 | Cheon et al. |
| 10,937,853 B2 | 3/2021 | Choi et al. |
| 11,114,521 B2 | 9/2021 | Son et al. |
| 11,444,146 B2 | 9/2022 | Kim et al. |
| 2008/0119061 A1 | 5/2008 | Hwang et al. |
| 2009/0045727 A1 | 2/2009 | Kwak et al. |

(Continued)

FOREIGN PATENT DOCUMENTS

| | | |
|---|---|---|
| KR | 100881183 B1 | 2/2009 |
| KR | 1020140134620 A | 11/2014 |

(Continued)

*Primary Examiner* — Wael M Fahmy
*Assistant Examiner* — Fernando Jose Ramos-Diaz
(74) *Attorney, Agent, or Firm* — CANTOR COLBURN LLP

(57) ABSTRACT

A display device includes a display panel including a display area and a pad area. The display panel includes a base substrate, a pixel, a pad group, an alignment mark, and a protective layer. The pad group includes a plurality of pads arranged in a first direction. The alignment mark is spaced apart from the pad group in the first direction. The protective layer covers the pads and the alignment mark and a plurality of openings respectively exposing upper surfaces of the pads is defined in the protective layer. Each of the pads includes at least one pad pattern, and the alignment mark is disposed in a same layer as a pad pattern spaced farthest from the base substrate among the at least one pad pattern.

14 Claims, 10 Drawing Sheets

(56) References Cited

U.S. PATENT DOCUMENTS

| | | | |
|---|---|---|---|
| 2014/0340593 A1 | 11/2014 | Sato et al. | |
| 2014/0346475 A1* | 11/2014 | Cho | H10D 86/423 |
| | | | 438/4 |
| 2017/0186831 A1* | 6/2017 | Nam | H01L 23/544 |
| 2019/0393277 A1* | 12/2019 | An | H10K 59/131 |

FOREIGN PATENT DOCUMENTS

| | | |
|---|---|---|
| KR | 1020190064991 A | 6/2019 |
| KR | 1020190090896 A | 8/2019 |
| KR | 1020200000508 A | 1/2020 |
| KR | 1020200046213 A | 5/2020 |
| KR | 1020210002287 A | 1/2021 |
| KR | 1020210027704 A | 3/2021 |
| KR | 1020210134877 A | 11/2021 |

\* cited by examiner

DISPLAY DEVICE

This application claims priority to Korean Patent Application No. 10-2022-0000998, filed on Jan. 4, 2022, and all the benefits accruing therefrom under 35 U.S.C. § 119, the content of which in its entirety is herein incorporated by reference.

BACKGROUND

1. Field

Embodiments of the invention relate to a display device including an alignment mark.

2. Description of the Related Art

A display device includes a display panel and a circuit film. The display panel is electrically connected to the circuit film. The circuit film is electrically connected to a pad of the display panel by an anisotropic conductive film, or electrodes of the circuit film are electrically connected to pads of the display panel by an ultrasonic bonding method, for example. An alignment mark, e.g., a printed circuit board ("PCB") fiducial mark, is used to improve an accuracy in connection between the circuit film and the display panel.

SUMMARY

Embodiments of the invention provide a display device with improved reliability.

An embodiment of the invention provides a display device including a display panel including a display area and a pad area. The display panel includes a base substrate, a pixel, a pad group, an alignment, and a protective layer. The pixel is disposed on the base substrate in the display area. The pad group is disposed on the base substrate in the pad area and includes a plurality of pads arranged in a first direction. The alignment mark is disposed on the base substrate in the pad area and is spaced apart from the pad group in the first direction. The protective layer which covers the plurality of pads and the alignment mark and in which a plurality of openings respectively exposing upper surfaces of the plurality of pads is defined. Each of the plurality of pads includes at least one pad pattern, and the alignment mark is disposed in the same layer as a pad pattern spaced farthest from the base substrate among the at least one pad pattern.

In an embodiment, the pixel may include a pixel circuit including at least one transistor and a light-emitting element electrically connected to the pixel circuit, and the at least one transistor may include an active area, a gate electrode, a source electrode, and a drain electrode.

In an embodiment, the at least one pad pattern may include a first pad pattern and a second pad pattern disposed on the first pad pattern and electrically connected to the first pad pattern. The alignment mark may be disposed in the same layer as the second pad pattern, and the alignment mark includes the same material as a material of the second pad pattern.

In an embodiment, the first pad pattern may be disposed in the same layer as the gate electrode, the second pad pattern is disposed in the same layer as the source electrode and the drain electrode, and the alignment mark may be disposed in the same layer as the source electrode and the drain electrode.

In an embodiment, the display device further may include a light shielding pattern disposed between the at least one transistor and the base substrate.

In an embodiment, the first pad pattern may be disposed in the same layer as the light shielding pattern, the second pad pattern may be disposed in the same layer as the source electrode and the drain electrode, and the alignment mark may be disposed in the same layer as the source electrode and the drain electrode.

In an embodiment, the first pad pattern may be disposed in the same layer as the light shielding pattern, the second pad pattern may be disposed in the same layer as the gate electrode, and the alignment mark may be disposed in the same layer as the gate electrode.

In an embodiment, the at least one pad pattern further may include a third pad pattern disposed between the first pad pattern and the second pad pattern and electrically connected to the first and second pad patterns.

In an embodiment, the first pad pattern may be disposed in the same layer as the light shielding pattern, the third pad pattern may be disposed in the same layer as the gate electrode, and the second pad pattern may be disposed in the same layer as the source electrode and the drain electrode, and the alignment mark may be disposed in the same layer as the source electrode and the drain electrode.

In an embodiment, the alignment mark is provided in plural, and alignment marks may be spaced apart from each other with the pad group interposed therebetween.

In an embodiment, the pad group may be provided in plural, and pad groups may be spaced apart from each other in the first direction.

In an embodiment, the display device further may include a circuit film electrically connected to the pad group, and the circuit film may include a plurality of connection electrodes electrically connected to the plurality of pads, respectively, and a substrate alignment mark aligned with the alignment mark.

In an embodiment, the pad pattern spaced farthest from the base substrate may include a first conductive layer and a second conductive layer disposed on the first conductive layer, and the second conductive layer may include indium tin oxide.

In an embodiment, the display device may further include a plurality of additional conductive patterns disposed on the protective layer and respectively in contact with the upper surfaces of the plurality of pads, and each of the plurality of additional conductive patterns may include indium tin oxide.

An embodiment of the invention provides a display device including a display panel including a display area and a pad area. The display panel includes a base substrate, a transistor, a pixel, a light shielding pattern, a pad group, an alignment mark, and a protective layer. The transistor includes an active area, a gate electrode, a source electrode, and a drain electrode. The pixel includes a pixel circuit including the transistor and a light-emitting element electrically connected to the pixel circuit. The light shielding pattern is disposed between the transistor and the base substrate. The pad group is disposed on the base substrate in the pad area and includes a plurality of pads arranged in a first direction. The alignment mark is disposed on the base substrate in the pad area and spaced apart from the pad group in the first direction. The protective layer covers the plurality of pads and the alignment mark and provided with a plurality of openings respectively exposing upper surfaces of the plurality of pads. The protective layer is directly in contact with a portion of each of uppermost surfaces of the plurality of pads and an uppermost surface of the alignment mark.

In an embodiment, each of the plurality of pads includes a first pad pattern and a second pad pattern disposed on the first pad pattern and electrically connected to the first pad pattern, and the alignment mark is disposed in the same layer as the second pad pattern.

In an embodiment, the first pad pattern is disposed in the same layer as the light shielding pattern, the second pad pattern is disposed in the same layer as the source electrode and the drain electrode, and the alignment mark is disposed in the same layer as the source electrode and the drain electrode.

In an embodiment, the first pad pattern may be disposed in the same layer as the light shielding pattern, the second pad pattern may be disposed in the same layer as the gate electrode, and the alignment mark may be disposed in the same layer as the gate electrode.

In an embodiment, the first pad pattern may be disposed in the same layer as the gate electrode, the second pad pattern may be disposed in the same layer as the source electrode and the drain electrode, and the alignment mark may be disposed in the same layer as the source electrode and the drain electrode.

In an embodiment, each of the plurality of pads further may include a third pad pattern disposed between the first pad pattern and the second pad pattern and electrically connected to the first and second pad patterns. The first pad pattern may be disposed in the same layer as the light shielding pattern, the third pad pattern is disposed in the same layer as the gate electrode, and the second pad pattern may be disposed in the same layer as the source electrode and the drain electrode, and the alignment mark may be disposed in the same layer as the source electrode and the drain electrode.

According to the above, the alignment mark is disposed in the same layer as the pad pattern. When the pad includes the plural pad patterns, the alignment mark is disposed in the same layer as the pad pattern disposed at an uppermost position. That is, since the pad pattern and the alignment mark are simultaneously formed through the same process, a position tolerance of the pad pattern does not affect an alignment of the circuit film and the display panel when the circuit film is aligned with the display panel. Accordingly, an alignment tolerance between the electrode of the circuit film and the opening of the protective layer, which exposes the upper surface of the pad pattern, is reduced compared to when the alignment mark is disposed in a different layer from a layer in which the pad pattern is disposed. That is, an accuracy in alignment between the circuit film and the display panel is improved, and thus, a product reliability of the display device may be improved.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
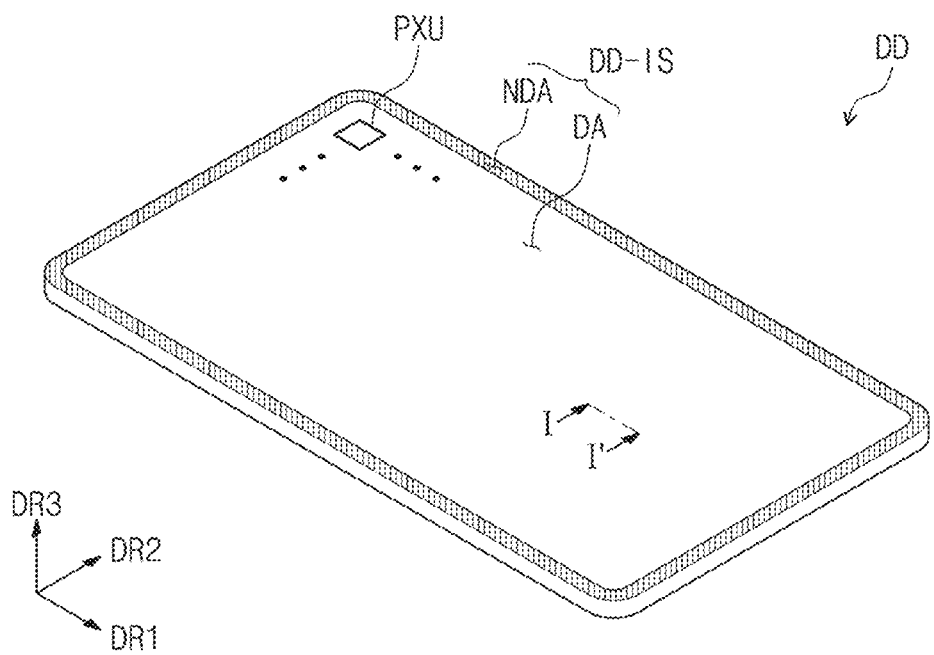
FIG. 1 is a perspective view of an embodiment of a display device according to the invention.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

The term "part" or "unit" as used herein is intended to mean a software component or a hardware component that performs a predetermined function. The hardware component may include, e.g., a field-programmable gate array ("FPGA") or an application-specific integrated circuit ("ASIC"). The software component may refer to an executable code and/or data used by the executable code in an addressable storage medium. Thus, the software components may be, e.g., object-oriented software components, class components, and task components, and may include processes, functions, attributes, procedures, subroutines, segments of program code, drivers, firmware, micro codes, circuits, data, a database, data structures, tables, arrays, or variables.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to accompanying drawings.

Figure 2:
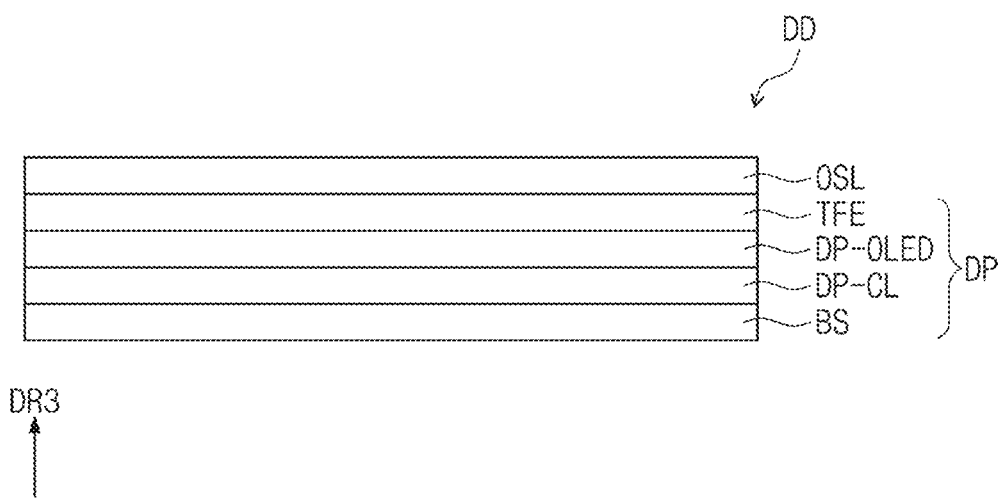
FIG. 2 is a cross-sectional view of an embodiment of a display device according to the invention.

FIG. 1 is a perspective view of an embodiment of a display device DD according to the invention. FIG. 2 is a cross-sectional view of an embodiment of the display device DD according to the invention.

Referring to FIGS. 1 and 2, the display device DD may display an image through a display surface DD-IS. The display surface DD-IS may be substantially parallel to a plane defined by a first direction DR1 and a second direction DR2. An upper surface of a member disposed at an uppermost position of the display device DD may be defined as the display surface DD-IS.

A third direction DR3 may indicate a normal line direction of the display surface DD-IS, i.e., a thickness direction of the display device DD. Front (or upper) and rear (or lower) surfaces of each layer or each unit may be distinguished from each other by the third direction DR3.

The display device DD may include a display area DA and a non-display area NDA. Unit pixels PXU may be arranged in the display area DA, and the unit pixels PXU may not be arranged in the non-display area NDA. The non-display area NDA may be defined along an edge of the display surface DD-IS. The non-display area NDA may surround the display area DA. In an alternative embodiment, the non-display area NDA may be omitted or may be defined adjacent to only one side of the display area DA. FIG. 1 shows a flat display device DD as an illustrative embodiment, however, the display device DD may have a curved shape.

The display device DD may include a display panel DP and a light control layer OSL. A protective film, a window, or a functional coating layer that provides a front surface of the display device DD may be further disposed on the light control layer OSL.

The display panel DP may include a base substrate BS, a circuit element layer DP-CL, an element layer DP-OLED, and an encapsulation layer TFE. The circuit element layer DP-CL, the element layer DP-OLED, and the encapsulation layer TFE may be sequentially stacked on the base substrate BS. The display panel DP may substantially generate the image. The display panel DP may be a light-emitting type display panel. In an embodiment, the display panel DP may be an organic light-emitting display panel, an inorganic light-emitting display panel, an organic-inorganic light-emitting display panel, a quantum dot display panel, a micro-light-emitting diode ("micro-LED") display panel, or a nano-LED display panel, for example.

The base substrate BS may provide a base surface on which the circuit element layer DP-CL is disposed. The base substrate BS may be a glass substrate, a metal substrate, or a polymer substrate, however, the invention should not be limited thereto or thereby. In an embodiment, the base substrate BS may be an inorganic layer, an organic layer, or a composite material layer.

The circuit element layer DP-CL may include a driving circuit or a signal line of the unit pixel PXU. The element layer DP-OLED may include a light-emitting element disposed in each of the unit pixels PXU.

The encapsulation layer TFE may include at least one inorganic layer and an organic layer to encapsulate the light-emitting element.

The light control layer OSL may convert an optical property of a source light generated by the light-emitting element. The light control layer OSL may include a light conversion pattern that converts the source light to a light with a different color and a scattering pattern that scatters the source light.

Figure 3:
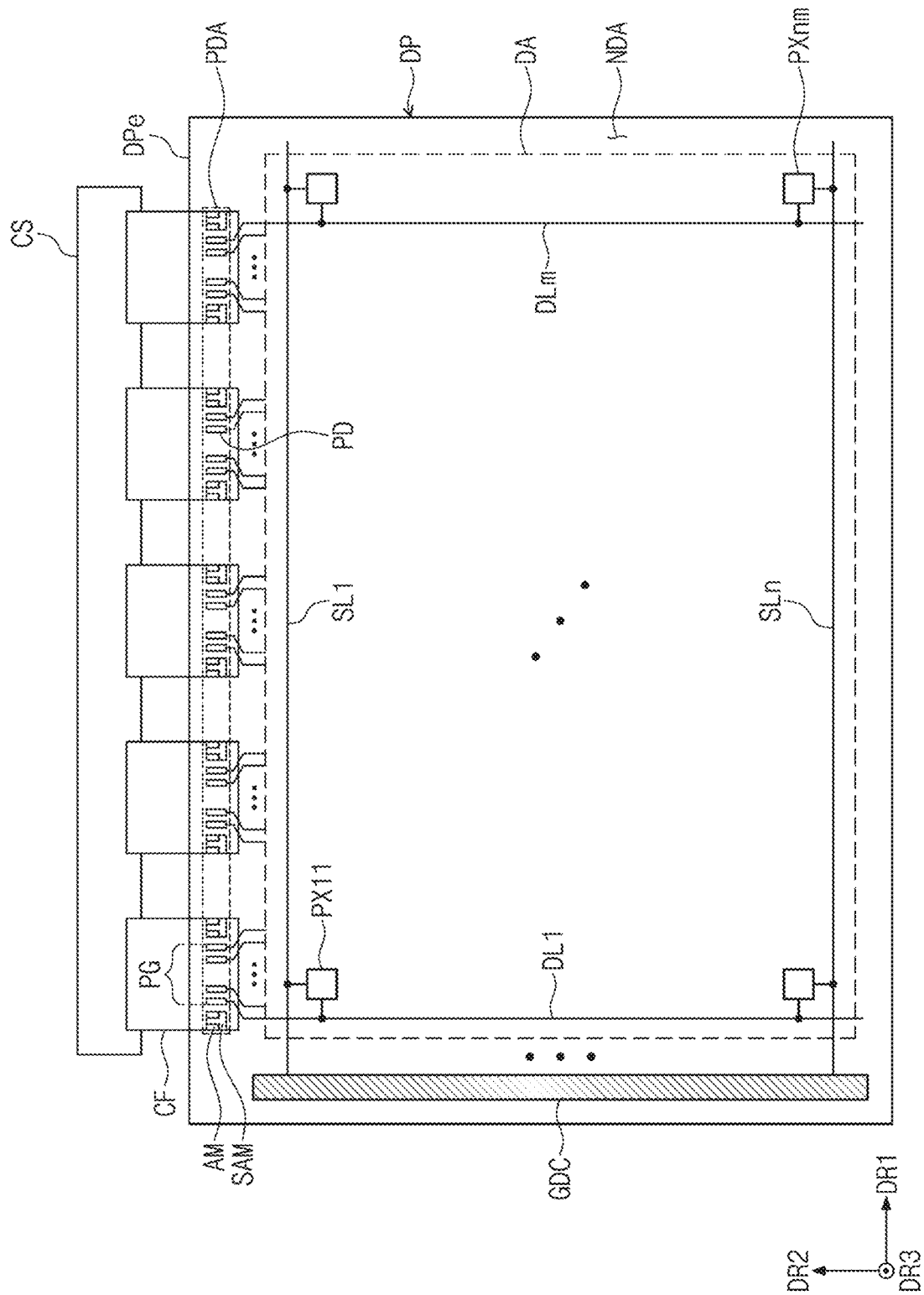
FIG. 3 is a plan view of an embodiment of a display panel and a circuit film according to the invention.
Figure 4A:
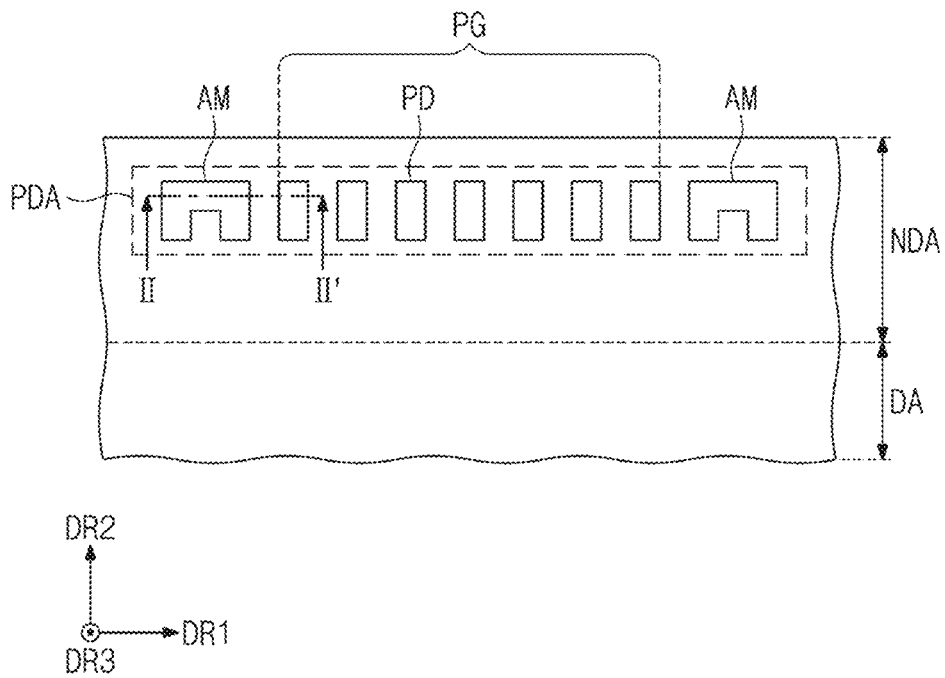
FIG. 4A is an enlarged view of an embodiment of a portion of a display panel according to the invention.
Figure 4B:
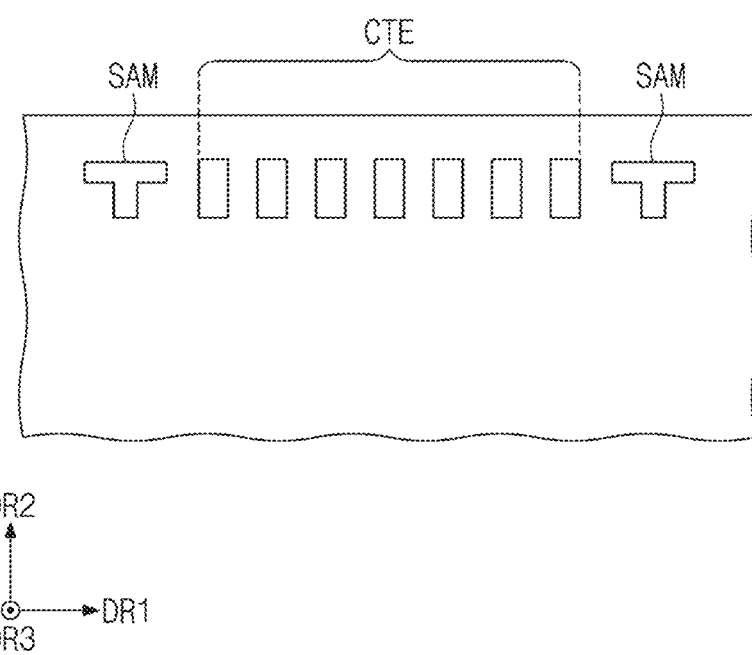
FIG. 4B is an enlarged view of an embodiment of a portion of a circuit film according to the invention.
Figure 4C:
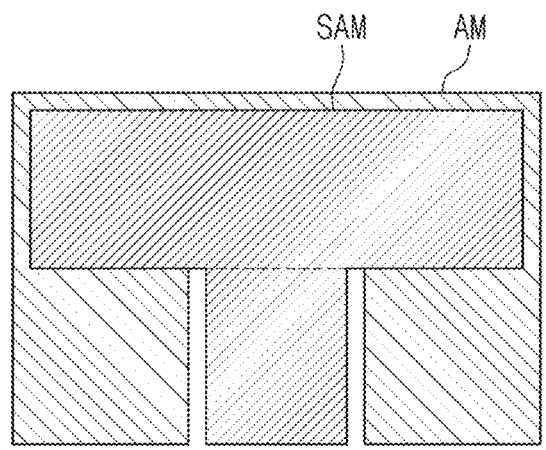
FIG. 4C is an enlarged view of an embodiment of an alignment mark and a substrate alignment mark according to the invention.

FIG. 3 is a plan view of an embodiment of a display panel DP and a circuit film CF according to the invention. FIG. 4A is an enlarged view of an embodiment of a portion of the display panel DP according to the invention. FIG. 4B is an enlarged view of an embodiment of a portion of the circuit film CF according to the invention. FIG. 4C is an enlarged view of an embodiment of an alignment mark AM and a substrate alignment mark SAM according to the invention.

Referring to FIGS. 3 and 4A to 4C, the display panel DP may include a display area DA and a pad area PDA. FIG. 3 shows an arrangement relationship between signal lines SL1 to SLn and DL1 to DLm and pixels PX11 to PXnm included in the display panel DP. Here, n and m are natural numbers. The signal lines SL1 to SLn and DL1 to DLm may include a plurality of scan lines SL1 to SLn and a plurality of data lines DL1 to DLm.

Each of the pixels PX11 to PXnm may be connected to a corresponding scan line among the scan lines SL1 to SLn and a corresponding data line among the data lines DL1 to DLm. Each of the pixels PX11 to PXnm may include a pixel driving circuit and a light-emitting element. More types of signal lines may be provided in the display panel DP according to a configuration of the pixel driving circuit of each of the pixels PX11 to PXnm.

The display area DA and the non-display area NDA of the display device DD shown in FIG. 1 may be applied to the display panel DP. The pixels PX11 to PXnm may be arranged in the display area DA, and a gate driving circuit GDC may be disposed in the non-display area NDA, however, this is merely some of embodiments. In an embodiment, at least a portion or all of the gate driving circuit GDC may be disposed in the display area DA. Among the pixels PX11 to PXnm, some pixels may be grouped into one group, and the group may be repeatedly arranged. The group may correspond to the unit pixel PXU described with reference to FIG. 1.

The display panel DP may include a plurality of pad groups PG. The pad groups PG may be spaced apart from each other in the first direction DR1. The pad group PG may include a plurality of pads PD. The pads PD may be disposed on the base substrate BS. The pads PD may be spaced apart from each other in the first direction DR1.

The pads PD may be disposed in the non-display area NDA. In an embodiment, a pad area PDA may be defined in the non-display area NDA to be adjacent to an edge DPe of the display panel DP, and the pads PD may be disposed in the pad area PDA. The pad area PDA may be defined between the display area DA and the edge DPe of the display panel DP. A circuit board CS, e.g., a flexible circuit film, may be electrically connected to the pads PD. In an embodiment, the circuit board CS may be electrically connected to the pads PD by an anisotropic conductive film. In an embodiment, electrodes of the circuit board CS may be electrically connected to the pads PD by an ultrasonic bonding method without using the anisotropic conductive film.

A driving chip (not shown) may include a driving element, e.g., a data driving circuit, to drive the pixels PX11 to PXnm of the display panel DP. The driving chip may be disposed (e.g., mounted) on the display panel DP, e.g., in the pad area PDA, or may be disposed (e.g., mounted) on the circuit board CS.

Figure 9:
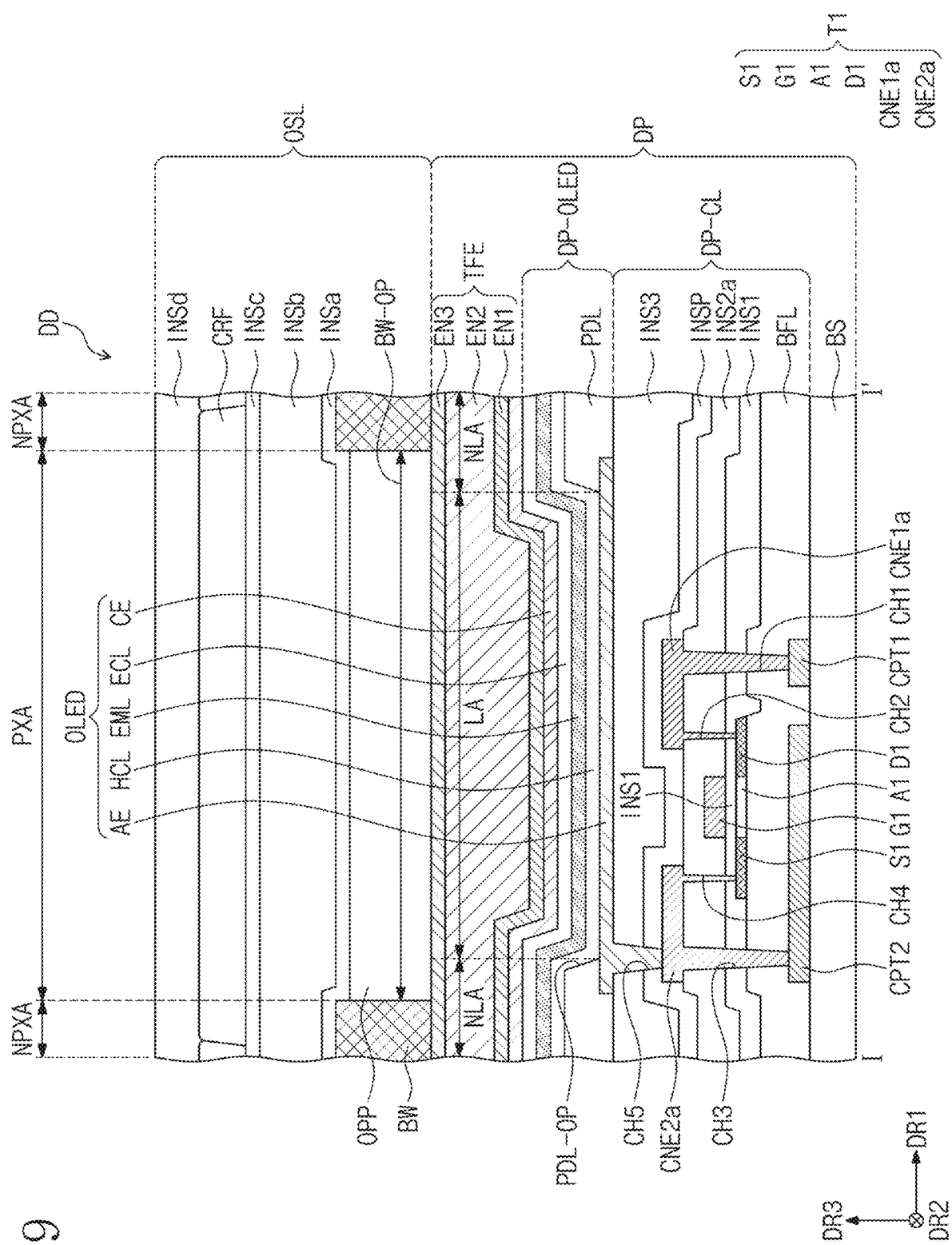
FIG. 9 is a cross-sectional view of an embodiment of a display device according to the invention.

The display panel DP may include the base substrate BS (refer to FIG. 5), the pixels PX11 to PXnm, the pad group PG, the alignment mark AM, and a protective layer INS2 (refer to FIG. 5) or INSP (refer to FIG. 9). The pixels PX11 to PXnm may be disposed on the base substrate BS.

The alignment mark AM may be disposed on the base substrate BS and may be disposed in the pad area PDA. The alignment mark AM may be spaced apart from the pad group PG in the first direction DR1. In an embodiment, the alignment mark AM may be provided in plural, and the alignment marks AM may be spaced apart from each other with the pad group PG interposed therebetween. The protective layer INS2 or INSP will be described in detail later.

The display device DD (refer to FIG. 1) may further include a circuit film CF. The circuit film CF may be provided in plural. One circuit film CF may be coupled with one pad group PG. The circuit films CF may be connected to the pad groups PG, respectively.

The circuit film CF may include a plurality of connection electrodes CTE (refer to FIG. 4B) and a substrate alignment mark SAM. The connection electrodes CTE may be electrically connected to the pads PD, respectively. The substrate alignment mark SAM may be aligned with the alignment mark AM in a plan view.

In a process of attaching the circuit film CF to the pad area PDA of the display panel DP, it is important to precisely control a position of an area to which the circuit film CF is attached. The circuit film CF may be aligned with the display panel DP through a process of aligning left and right ends of the alignment mark AM disposed in the pad area PDA with left and right ends of the substrate alignment mark AM disposed in the circuit film CF, and then the circuit film CF may be attached to the display panel DP.

Figure 5:
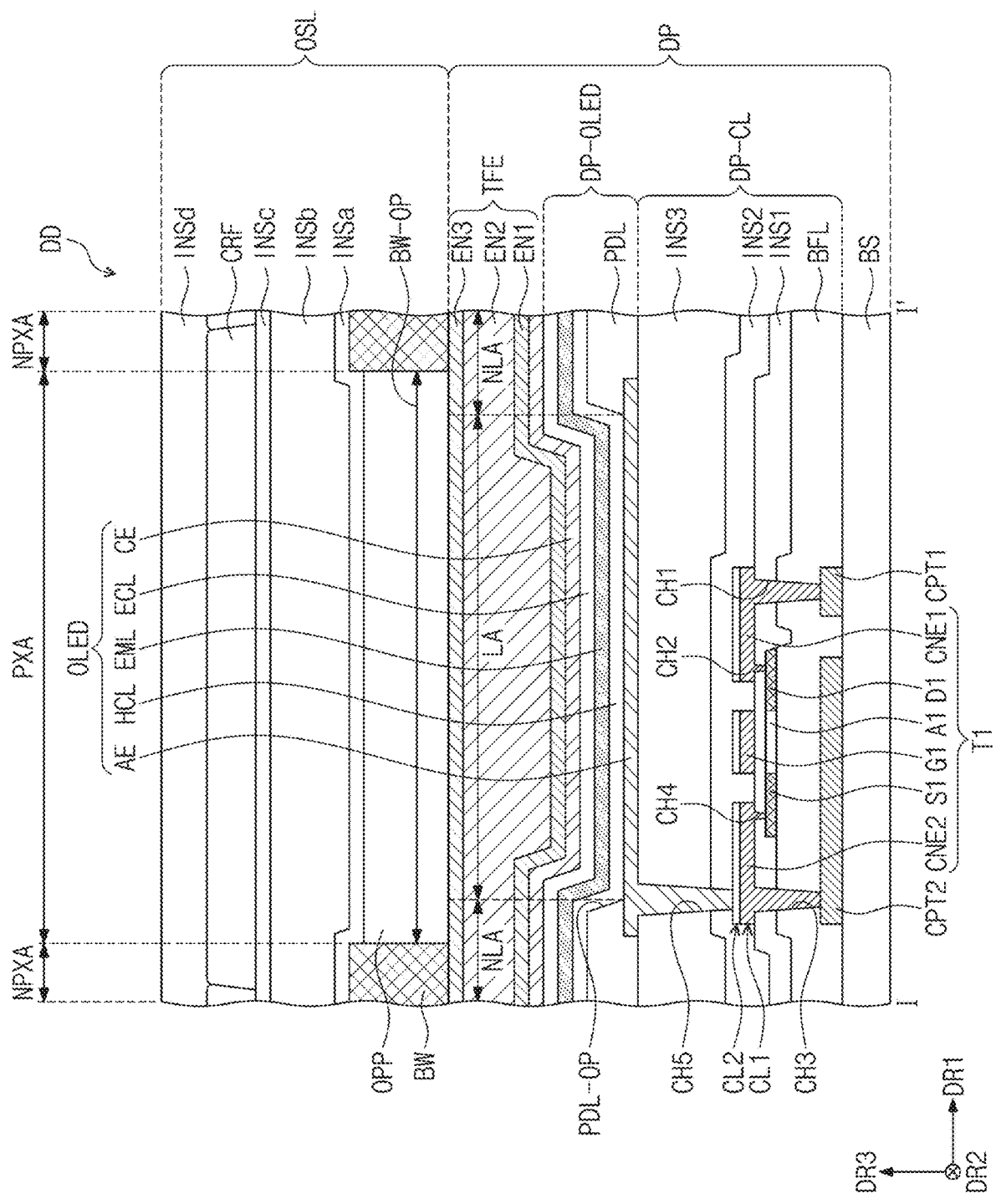
FIG. 5 is a cross-sectional view of an embodiment of a display device according to the invention.

FIG. 5 is a cross-sectional view of an embodiment of the display device DD according to the invention. FIG. 5 is a cross-sectional view taken along line I-I' of FIG. 1.

FIG. 5 shows a cross-section of a first transistor T1 and one pixel area PXA corresponding to the first transistor T1. The unit pixel PXU (refer to FIG. 1) may include a pixel circuit (not shown) including at least one transistor and a light-emitting element OLED electrically connected to the pixel circuit (not shown). The first transistor T1 may include a channel area A1 (or an active area), a gate electrode G1, a drain electrode CNE1, and a source electrode CNE2.

The display device DD may include the display panel DP and the light control layer OSL. The display panel DP may include the base substrate BS, the circuit element layer DP-CL, the element layer DP-OLED, and the encapsulation layer TFE.

A power line CPT1 and a light shielding pattern CPT2 of the circuit element layer DP-CL may be disposed on the base substrate BS. The power line CPT1 and the light shielding pattern CPT2 may include a metal material. A buffer layer BFL may be disposed on the base substrate BS and may cover the power line CPT1 and the light shielding pattern CPT2. The light shielding pattern CPT2 may be disposed between the first transistor T1 and the base substrate BS.

A semiconductor pattern (D1, A1, and S1) may be disposed on the buffer layer BFL to overlap the light shielding pattern CPT2. The semiconductor pattern D1, A1, and S1 may include a source area S1, the channel area A1 (or the active area), and a drain area D1. The semiconductor pattern (D1, A1, and S1) may have different electrical properties depending on whether it is doped or not or whether it is doped with an N-type dopant or a P-type dopant. The semiconductor pattern (D1, A1, and S1) may include a first region (D1 and S1) having a relatively high conductivity and a second region (A1) having a relatively low conductivity. The first region (D1 and S1) may be doped with the N-type dopant or the P-type dopant. A P-type transistor may include a doped region doped with the P-type dopant, and an N-type transistor may include a doped region doped with the N-type dopant. The second region (A1) may be a non-doped region or a region doped at a concentration lower than that of the first region (D1 and S1).

The first insulating layer INS1 may be disposed on portions of the semiconductor pattern (D1, A1, and S1) and the buffer layer BFL. FIG. 5 shows a structure in which the first insulating layer INS1 is disposed on the buffer layer BFL as an integral shape, however, the invention should not be limited thereto or thereby. In an embodiment, the first insulating layer INS1 may be patterned to have a predetermined shape and may overlap the gate electrode G1, the drain electrode CNE1, and the source electrode CNE2. In detail, the first insulating layer INS1 may include insulating patterns, and the insulating patterns may be separated from each other and may respectively overlap the gate electrode G1, the drain electrode CNE1, and the source electrode CNE2. Each of the buffer layer BFL and the first insulating layer INS1 may be an inorganic layer.

The gate electrode G1, the drain electrode CNE1, and the source electrode CNE2 may be disposed on the first insulating layer INS1.

The drain electrode CNE1 may be connected to the power line CPT1, which supplies a power to the light-emitting element OLED, via a first contact hole CH1 defined through the first insulating layer INS1 and the buffer layer BFL. A first voltage (not shown) may be supplied to the first transistor T1 through the power line CPT1. The drain electrode CNE1 may be connected to the drain area D1 via a second contact hole CH2 defined through the first insulating layer INS1.

The source electrode CNE2 may be connected to the light shielding pattern CPT2 via a third contact hole CH3 defined through the first insulating layer INS1 and the buffer layer BFL. The source electrode CNE2 may be connected to the source area S1 via a fourth contact hole CH4 defined through the first insulating layer INS1.

The protective layer INS2 may be disposed on the gate electrode G1, the drain electrode CNE1, and the source electrode CNE2. The protective layer INS2 may include an inorganic material. The protective layer INS2 may be disposed on the buffer layer BFL to cover the gate electrode G1, the drain electrode CNE1, and the source electrode CNE2. The protective layer INS2 may be also referred to as a second insulating layer.

The third insulating layer INS3 may be disposed on the protective layer INS2. The third insulating layer INS3 may include an organic layer. The third insulating layer INS3 may provide a flat upper surface. The layers from the buffer layer BFL to the third insulating layer INS3, which are provided with the first transistor T1, may be defined as the circuit element layer DP-CL.

The element layer DP-OLED may be disposed on the circuit element layer DP-CL. The element layer DP-OLED may include the light-emitting element OLED and a pixel definition layer PDL. In addition, although not shown in drawing figures, the element layer DP-OLED may further include a spacer disposed on the pixel definition layer PDL. The light-emitting element OLED may include a first electrode AE (or an anode), a hole control layer HCL, a light-emitting layer EML, an electron control layer ECL, and a second electrode CE (or cathode).

The first electrode AE may be disposed on the third insulating layer INS3, and the first electrode AE may be connected to the source electrode CNE2 via a fifth contact hole CH5 defined through the third insulating layer INS3 and the protective layer INS2. As the first electrode AE is connected to the source electrode CNE2, the source area S1 may be connected to the light-emitting element OLED via the source electrode CNE2.

The pixel definition layer PDL may be disposed on the third insulating layer INS3 and a portion of the first electrode AE. An opening PDL-OP may be defined through the pixel definition layer PDL, and at least a portion of the first electrode AE may be exposed through the opening PDL-OP. The opening PDL-OP of the pixel definition layer PDL may define a light-emitting area LA. An area in which the pixel definition layer PDL is disposed may be defined as a non-light-emitting area NLA.

The hole control layer HCL may be commonly disposed over the light-emitting area LA and the non-light-emitting area NLA. A common layer such as the hole control layer HCL may be commonly formed or disposed in the display area DA shown in FIG. 3 to overlap the pixels PX1 to PXnm. The hole control layer HCL may include a hole transport layer and a hole injection layer.

The light-emitting layer EML may be disposed on the hole control layer HCL. The light-emitting layer EML may be commonly disposed over the light-emitting area LA and the non-light-emitting area NLA. The light-emitting layer EML may generate the source light. In the illustrated embodiment, the source light may be a blue light and hereinafter will be described as a first color light.

The electron control layer ECL may be disposed on the light-emitting layer EML. The electron control layer ECL may include an electron transport layer and an electron injection layer. The electron control layer ECL may be commonly disposed over the light-emitting area LA and the non-light-emitting area NLA.

The second electrode CE may be disposed on the electron control layer ECL. The second electrode CE may be commonly disposed in the pixels PX11 to PXmn (refer to FIG. 3).

The encapsulation layer TFE may be disposed on the second electrode CE and may cover the light-emitting element OLED. The encapsulation layer TFE may include a first inorganic encapsulation layer EN1 disposed on the second electrode CE, an organic encapsulation layer EN2 disposed on the first inorganic encapsulation layer EN1, and a second inorganic encapsulation layer EN3 disposed on the organic encapsulation layer EN2. The first and second inorganic encapsulation layers EN1 and EN3 may include an inorganic material, and the organic encapsulation layer EN2 may include an organic material. The first and second inorganic encapsulation layers EN1 and EN3 may protect the light-emitting element OLED from moisture and oxygen. The organic encapsulation layer EN2 may protect the light-emitting element OLED from a foreign substance such as dust particles.

The light control layer OSL may be disposed on the encapsulation layer TFE. In the illustrated embodiment, the light control layer OSL may contact the inorganic layer disposed at an uppermost position of the encapsulation layer TFE, however, an additional buffer layer may be further disposed between the inorganic layer disposed at an uppermost position of the encapsulation layer TFE and the light control layer OSL.

A barrier wall BW (or a division pattern) may be disposed on the encapsulation layer TFE. The barrier wall BW may overlap the non-light-emitting area NLA. An opening BW-OP may be defined through the barrier wall BW. The opening BW-OP may define the pixel area PXA corresponding to the light-emitting area LA.

An optical pattern OPP may be disposed in the opening BW-OP. The optical pattern OPP may contact an inner surface of the barrier wall BW defining the opening BW-OP. The optical pattern OPP may be a light conversion pattern or a scattering pattern. In an embodiment, in a case where the pixel area PXA is a green or red pixel area, the optical pattern OPP may be a light conversion pattern. The light conversion pattern may absorb the source light generated by the light-emitting element OLED and may generate a light having a different color from that of the source light, and the light having the different color may be a green light or a red light. In an embodiment, in a case where the pixel area PXA is a blue pixel area, the optical pattern OPP may be the scattering pattern. The scattering pattern may scatter the source light generated by the light-emitting element OLED.

A first insulating layer INSa may cover the barrier wall BW and the optical pattern OPP. The first insulating layer INSa may be an inorganic layer encapsulating the barrier wall BW and the optical pattern OPP. In an alternative embodiment, the first insulating layer INSa may be omitted.

A second insulating layer INSb may be disposed on the first insulating layer INSa. The second insulating layer INSb may have a refractive index lower than that of the second insulating layer INSa. In an embodiment, the refractive index of the second insulating layer INSb may be equal to or greater than about 1.1 and equal to or smaller than about 1.5 The refractive index of the second insulating layer INSb may be controlled based on a rate of a hollow inorganic particle and/or a void included in the second insulating layer INSb. The second insulating layer INSb may allow the source light and the converted light to travel more vertically.

The third insulating layer INSc may be disposed on the protective layer INSb. The third insulating layer INSc may be an inorganic layer encapsulating a structure disposed thereunder. In an alternative embodiment, the third insulating layer INSc may be omitted.

A color filter CRF may be disposed on the third insulating layer INSc to correspond to the pixel area PXA. The color filter CRF may reduce a reflectance with respect to an external light. The color filter CRF may overlap the pixel area PXA and a portion of the peripheral area NPXA which is adjacent to the pixel area PXA. The color filter CRF may partially overlap another color filter adjacent thereto.

The fourth insulating layer INSd may be disposed on the color filter CRF. The fourth insulating layer INSd may include an organic layer and may provide a flat surface.

Figure 6:
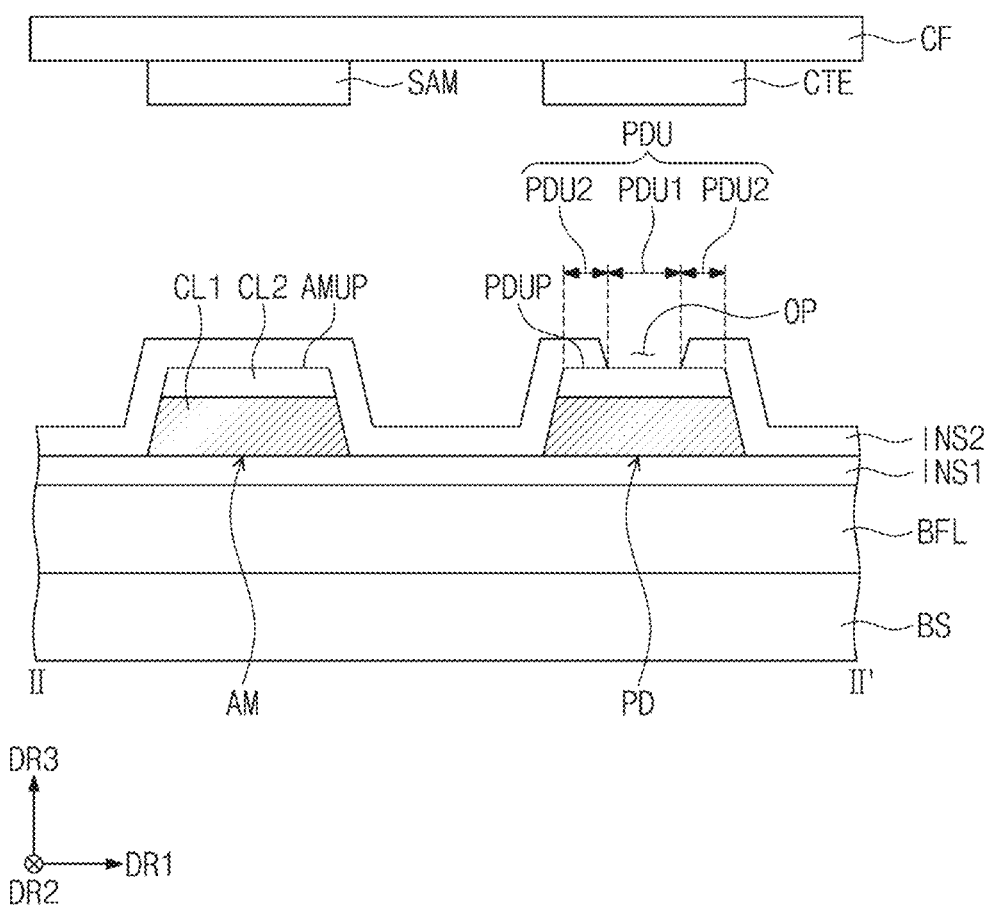
FIGS. 6 to 8 are cross-sectional views of an embodiment of display panels according to the invention.

FIG. 6 is a cross-sectional view of an embodiment of a display panel DP (refer to FIG. 2) according to the invention. FIG. 6 is a cross-sectional view taken along line II-II' of FIG. 4A.

Referring to FIGS. 5 and 6, the pad PD may include one pad pattern PD. Accordingly, the pad PD and the pad pattern PD may be assigned with the same reference numerals. The pad PD may be disposed on the first insulating layer INS1. The pad pattern PD may include the same material as that of the gate electrode G1, the drain electrode CNE1, and the source electrode CNE2 shown in FIG. 5 and may be formed through the same process as the gate electrode G1, the drain electrode CNE1, and the source electrode CNE2 shown in FIG. 5. FIG. 6 shows a structure in which the pad PD includes one pad pattern PD as an illustrative embodiment, however, it should not be particularly limited. In an embodiment, the pad PD may include a plurality of pad patterns. This will be described in detail later.

The alignment mark AM may be spaced apart from the pad PD in the first direction DR1. The alignment mark AM may be disposed in the same layer as the pad pattern PD.

The pad pattern PD may include a first conductive layer CL1 and a second conductive layer CL2 disposed directly on the first conductive layer CL1. The first conductive layer CL1 may have a double-layer structure in which titanium (Ti) and copper (Cu) are sequentially stacked, and the second conductive layer CL2 may include indium tin oxide ("ITO"). The alignment mark AM may include the first conductive layer CL1 and the second conductive layer CL2. The alignment mark AM and the pad pattern PD may be patterned through the same process.

The protective layer INS2 may cover the pad PD and the alignment mark AM. The protective layer INS2 may cover a second upper surface portion PDU2 of an upper surface PDU of the pad PD and may cover an entirety of the alignment mark AM. An opening OP may be defined through the protective layer INS2 to expose a first upper surface portion PDU1 of the upper surface PDU of the pad PD. In detail, the opening OP may be defined through the protective layer INS2 to expose the first upper surface portion PDU1 of the upper surface PDU of the pad PD. The second upper surface portion PDU2 of the upper surface PDU of the pad PD may be covered by the protective layer INS2. The second upper surface portion PDU2 may be a portion of the upper surface PDU connected to the side surfaces (not shown). The protective layer INS2 may be directly in contact with a portion of the uppermost upper surface PDUP of the pad PD and an uppermost upper surface AMUP of the alignment mark AM.

FIG. 6 shows a structure in which the protective layer INS2 covers one pad PD, however, the protective layer INS2 may cover the plural pads PD and the alignment mark AM. In addition, a plurality of openings OP may be defined through the protective layer INS2 to respectively expose the first upper surface portions PDU1 of the upper surfaces PDU of the pads PD.

The circuit film CF may include a substrate alignment mark SAM and a connection electrode CTE. The substrate alignment mark SAM and the connection electrode CTE may include the same material and may be formed through the same process. Accordingly, the substrate alignment mark SAM and the connection electrode CTE may be disposed in the same layer. The substrate alignment mark SAM of the circuit film CF may be aligned with the alignment mark AM of the display panel DP (refer to FIG. 5). As the substrate alignment mark SAM is aligned with the alignment mark AM, the connection electrode CTE of the circuit film CF may be aligned with the pad PD.

It is important to align a position of the connection electrode CTE of the circuit film CF with a position of the opening OP of the protective layer INS2 to allow the circuit film CF to be electrically connected to the pads PD. According to the disclosure, the alignment mark AM may be formed or disposed in the same layer as the pad pattern PD of an uppermost position. That is, since the pad pattern PD is formed through the same process as the alignment mark AM, a position tolerance of the pad pattern PD may not affect the alignment of the circuit film CF and the display panel DP when the circuit film CF is aligned with the display panel DP (refer to FIG. 3). In detail, since the same position tolerance as the position tolerance of the pad pattern PD occurs in the alignment mark AM when the position tolerance of the pad pattern PD occurs, the position tolerance of the pad pattern PD may not affect the alignment of the circuit film CF and the display panel DP when the circuit film CF is aligned with the display panel DP with respect to the alignment mark AM. Accordingly, an alignment tolerance between the connection electrode CTE of the circuit film CF and the opening OP of the protective layer INS2, which exposes the upper surface PDU1 of the pad pattern PD, may be reduced compared to when the alignment mark AM is disposed in a different layer from a layer in which the pad pattern PD is disposed. That is, an accuracy in alignment between the circuit film CF and the display panel DP may be improved, and thus, a product reliability of the display device DD (refer to FIG. 1) may be improved.

Figure 7:
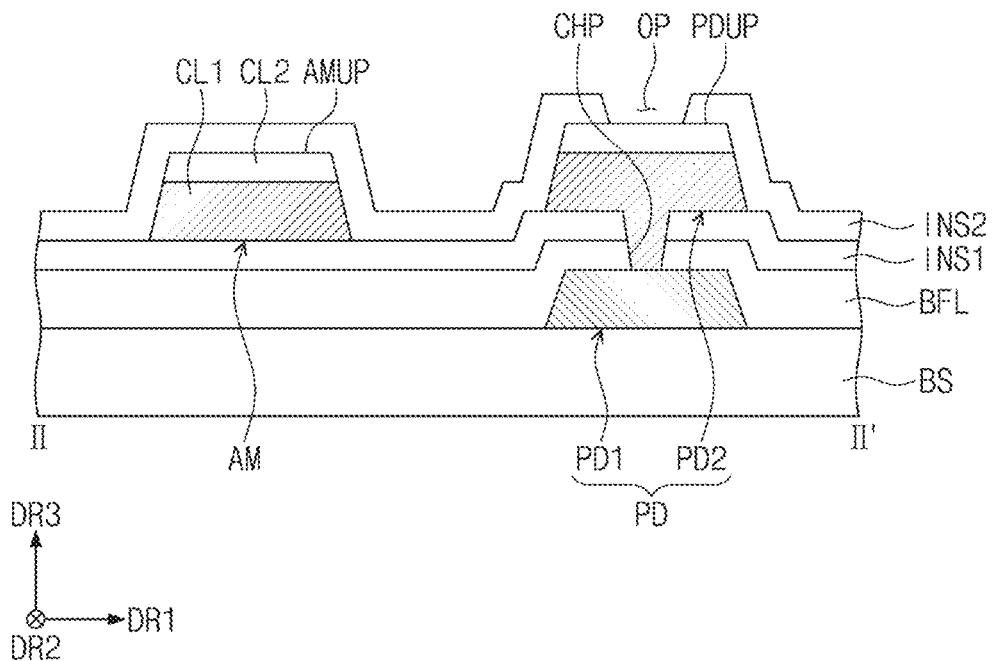

FIG. 7 is a cross-sectional view of an embodiment of a display panel DP (refer to FIG. 2) according to the invention. FIG. 7 is a cross-sectional view taken along line II-II' of FIG. 4A. In FIG. 7, the same reference numerals denote the same elements in FIG. 6, and thus, detailed descriptions of the same elements will be omitted.

Referring to FIGS. 5 and 7, a pad PD may include a first pad pattern PD1 and a second pad pattern PD2. The first pad pattern PD1 may be disposed on the base substrate BS. The second pad pattern PD2 may be disposed on the first insulating layer INS1. The second pad pattern PD2 may be disposed on the first pad pattern PD1 and may be electrically connected to the first pad pattern PD1 via a contact hole CHP defined through the first insulating layer INS1 and the buffer layer BFL.

The first pad pattern PD1 may be disposed in the same layer as the power line CPT1 and the light shielding pattern CPT2 shown in FIG. 5. The first pad pattern PD1 may include the same material as and may be formed through the same process as the power line CPT1 and light shielding pattern CPT2.

The second pad pattern PD2 may be disposed in the same layer as the gate electrode G1, the drain electrode CNE1, and the source electrode CNE2. The second pad pattern PD2 may include the same material as and may be formed through the same process as the gate electrode G1, the drain electrode CNE1, and the source electrode CNE2.

The first pad pattern PD1 may have a two-layer structure in which titanium (Ti) and copper (Cu) are sequentially stacked, and the second pad pattern PD2 may have a three-layer structure in which titanium (Ti), copper (Cu), and ITO are sequentially stacked. Among the first and second pad patterns PD1 and PD2, the second pad pattern PD2 spaced farthest from the base substrate BS may include the first conductive layer CL1 and the second conductive layer CL2 disposed directly on the first conductive layer CL1. The first conductive layer CL1 may have a two-layer structure in which titanium (Ti) and copper (Cu) are sequentially stacked, and the second conductive layer CL2 may include ITO, however, this is merely one of embodiments. In an embodiment, the metal material and the layer structure for the first and second pad patterns PD1 and PD2 and the first and second conductive layers CL1 and CL2 should not be limited thereto or thereby.

The alignment mark AM may be disposed in the same layer as the second pad pattern PD2 spaced farthest from the base substrate BS in the third direction DR3 among the first and second pad patterns PD1 and PD2. That is, the alignment mark AM may be disposed in the same layer as the second pad pattern PD2 and may include the same material as that of the second pad pattern PD2. That is, the alignment mark AM may be disposed in the same layer as the gate electrode G1 (refer to FIG. 5).

The protective layer INS2 may cover the pad PD and the alignment mark AM. The protective layer INS2 may be directly in contact with a portion of the uppermost upper surface PDUP of the pad PD and a portion of the uppermost upper surface AMUP of the alignment mark AM. The pad PD may be provided in plural, and the protective layer INS2 may be directly in contact with a portion of each of the uppermost upper surfaces PDUP of the pads PD and the uppermost upper surface AMUP of the alignment mark AM.

It is important to align the position of the connection electrode CTE of the circuit film CF (refer to FIG. 6) with the position of the opening OP of the protective layer INS2 to allow the circuit film CF to be electrically connected to the pads PD. According to the disclosure, the alignment mark AM may be formed or disposed in the same layer as the pad pattern PD of the uppermost position. That is, since the pad pattern PD is formed through the same process as the alignment mark AM, a position tolerance of the pad pattern PD2 may not affect the alignment of the circuit film CF and the display panel DP when the circuit film CF is aligned with the display panel DP (refer to FIG. 3). In detail, since the same position tolerance as the position tolerance of the pad pattern PD occurs in the alignment mark AM when the position tolerance of the pad pattern PD occurs, the position tolerance of the pad pattern PD may not affect the alignment of the circuit film CF and the display panel DP when the circuit film CF is aligned with the display panel DP with respect to the alignment mark AM. Accordingly, an alignment tolerance between the connection electrode CTE of the circuit film CF and the opening OP of the protective layer INS2, which exposes the upper surface of the pad pattern PDs, may be reduced compared when the alignment mark AM is disposed in a different layer from a layer in which the pad pattern PD is disposed. That is, an accuracy in alignment between the circuit film CF and the display panel DP may be improved, and thus, a product reliability of the display device DD (refer to FIG. 1) may be improved.

Figure 8:
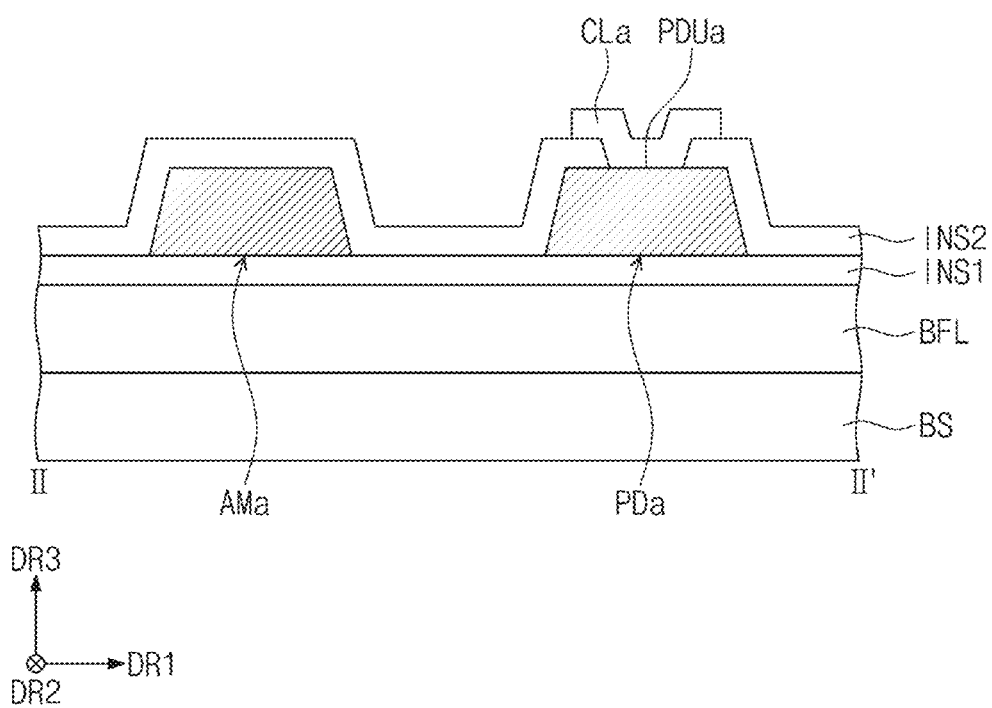

FIG. 8 is a cross-sectional view of an embodiment of a display panel DP (refer to FIG. 2) according to the invention. FIG. 8 is a cross-sectional view taken along line II-II' of FIG. 4A. In FIG. 8, the same reference numerals denote the same elements in FIG. 6, and thus, detailed descriptions of the same elements will be omitted.

Referring to FIG. 8, an additional conductive pattern CLa may be disposed on the protective layer INS2. The additional conductive pattern CLa may contact an upper surface of a pad pattern PDa. The additional conductive pattern CLa may include ITO.

FIG. 8 shows a structure in which one pad PDa is covered, however, the pad group PDA (refer to FIG. 3) may include a plurality of the plural pads PDa, and the protective layer INS2 may cover the pads PDa. Accordingly, the additional conductive patterns CLa of the display device DD (refer to FIG. 2) may be provided in plural, upper surfaces PDUa of the pads PDa may contact additional conductive patterns CLa, respectively, and each of the additional conductive patterns CLa may include ITO.

FIG. 9 is a cross-sectional view of an embodiment of a display device DD according to the invention. FIG. 9 is a cross-sectional view taken along line I-I' of FIG. 1. In FIG. 9, the same reference numerals denote the same elements in FIG. 5, and thus, detailed descriptions of the same elements will be omitted.

A gate electrode G1 may be disposed on a first insulating layer INS1. A second insulating layer INS2a may be disposed on a gate electrode G1 and may cover the gate electrode G1.

A drain electrode CNE1a may be connected to a power line CPT1, which supplies a power to a light-emitting element OLED, via a first contact hole CH1 defined through the second insulating layer INS2a, the first insulating layer INS1, and the buffer layer BFL. A first voltage (not shown) may be supplied to a first transistor T1 via the power line CPT1. The drain electrode CNE1a may be connected to a drain area D1 via a second contact hole CH2 defined through the second insulating layer INS2a and the first insulating layer INS1.

A source electrode CNE2a may be connected to a light shielding pattern CPT2 via a third contact hole CH3 defined through the second insulating layer INS2a, the first insulating layer INS1, and the buffer layer BFL. The source electrode CNE2a may be connected to a source area S1 via a fourth contact hole CH4 defined through the second insulating layer INS2a and the first insulating layer INS1.

A protective layer INSP may be disposed on the drain electrode CNE1a and the source electrode CNE2a and may cover the drain electrode CNE1a and the source electrode CNE2a. The third insulating layer INS3 may be disposed on the protective layer INSP. The third insulating layer INS3 may include an organic layer. The third insulating layer INS3 may provide a flat upper surface.

Figure 10:
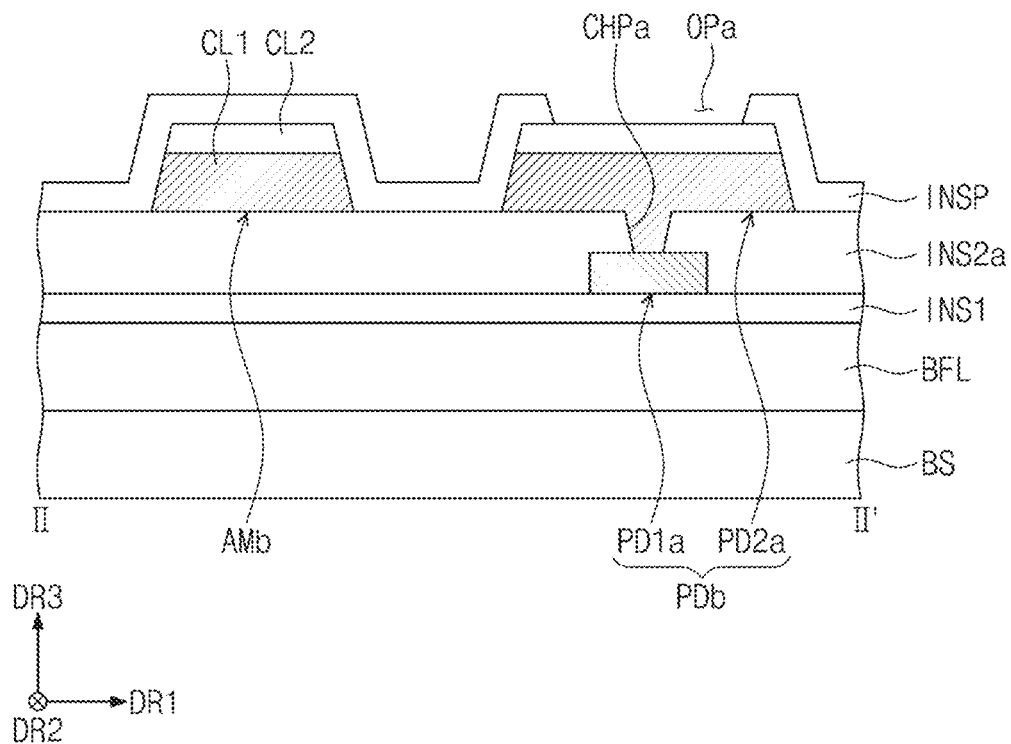
FIGS. 10 to 12 are cross-sectional views of an embodiment of display panels according to the invention.
Figure 11:
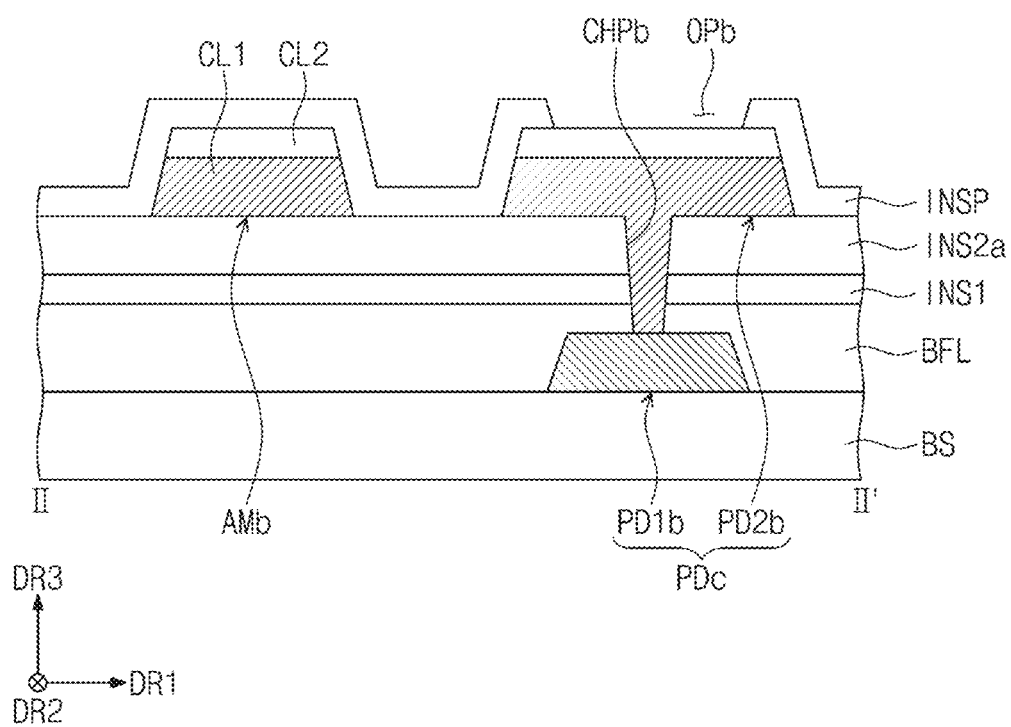
Figure 12:
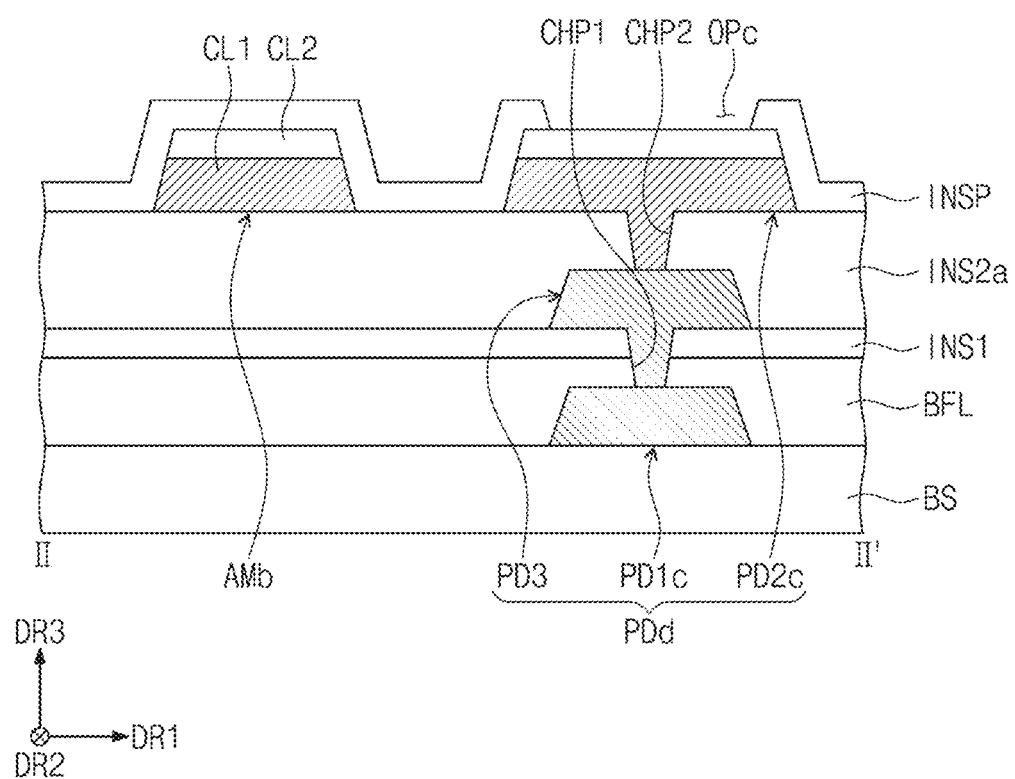

FIGS. 10 to 12 are cross-sectional views of an embodiment of display panels according to the invention. FIGS. 10 to 12 are cross-sectional views taken along line II-II' of FIG. 4A. In FIGS. 10 to 12, the same reference numerals denote the same elements in FIG. 7, and thus, detailed descriptions of the same elements will be omitted.

Referring to FIGS. 9 and 10, a pad PDb may include a first pad pattern PD1a and a second pad pattern PD2a. The first pad pattern PD1a may be disposed on a first insulating layer INS1. The second pad pattern PD2a may be disposed on a second insulating layer INS2a. The second pad pattern PD2a may be disposed on the first pad pattern PD1a and may be electrically connected to the first pad pattern PD1a via a contact hole CHPa defined through the second insulating layer INS2a.

The first pad pattern PD1a may be disposed in the same layer as the gate electrode G1 shown in FIG. 9. The first pad pattern PD1a may include the same material as and may be formed through the same process as the gate electrode G1.

The second pad pattern PD2a may be disposed in the same layer as a drain electrode CNE1a and a source electrode CNE2a. The second pad pattern PD2a may include the same material as and may be formed through the same process as the drain electrode CNE1a and the source electrode CNE2a.

A protective layer INSP may cover the second pad pattern PD2a and an alignment mark AMb. The protective layer INSP may cover a portion of an upper surface of the second pad pattern PD2a and may entirely cover the alignment mark AMb. An opening OPa may be defined through the protective layer INSP to expose the upper surface of the second pad pattern PD2a.

The alignment mark AMb may be disposed in the same layer as the second pad pattern PD2a spaced farthest from a base substrate BS among the first and second pad patterns PD1a and PD2a. That is, the alignment mark AMb may be disposed in the same layer as the second pad pattern PD2*a* and may include the same material as that of the second pad pattern PD2*a*. That is, the alignment mark AMb may be disposed in the same layer as the drain electrode CNE1*a* and the source electrode CNE2*a*.

Referring to FIGS. 9 and 11, a pad PDc may include a first pad pattern PD1*b* and a second pad pattern PD2*b*. The first pad pattern PD1*b* may be disposed on the base substrate BS. The second pad pattern PD2*b* may be disposed on the second insulating layer INS2*a*. The second pad pattern PD2*b* may be disposed on the first pad pattern PD1*b* and may be electrically connected to the first pad pattern PD1*b* via a contact hole CHPb defined through the second insulating layer INS2*a*.

The first pad pattern PD1*b* may be disposed in the same layer as the power line CPT1 and the light shielding pattern CPT2. The first pad pattern PD1*b* may include the same material as and may be formed through the same process as the power line CPT1 and the light shielding pattern CPT2.

The second pad pattern PD2*b* may be disposed in the same layer as the drain electrode CNE1*a* and the source electrode CNE2*a*. The second pad pattern PD2*b* may include the same materials as and may be formed through the same process as the drain electrode CNE1*a* and the source electrode CNE2*a*.

The protective layer INSP may cover a second pad pattern PD2*b* and an alignment mark AMb. The protective layer INSP may cover a portion of an upper surface of the second pad pattern PD2*b* and may entirely cover the alignment mark AMb. An opening OPb may be defined through the protective layer INSP to expose the portion of the upper surface of the second pad pattern PD2*b*.

The alignment mark AMb may be disposed in the same layer as the pad pattern PD2*b* spaced farthest from the base substrate BS among the first and second pad patterns PD1*b* and PD2*b*. That is, the alignment mark AMb may be disposed in the same layer as the second pad pattern PD2*b* and may include the same material as that of the second pad pattern PD2*b*. That is, the alignment mark AMb may be disposed in the same layer as the drain electrode CNE1*a* and the source electrode CNE2*a*.

Referring to FIGS. 9 and 12, a pad PDd may include a first pad pattern PD1*c*, a second pad pattern PD2*c*, and a third pad pattern PD3.

The first pad pattern PD1*c* may be disposed on the base substrate BS. The third pad pattern PD3 may be disposed on the first insulating layer INS1 and may be electrically connected to the first pad pattern PD1*c* via a first contact hole CHP1 defined through the first insulating layer INS1 and the buffer layer BFL. The second pad pattern PD2*c* may be disposed on the second insulating layer INS2*a* and may be electrically connected to the third pad pattern PD3 via a second contact hole CHP2. That is, the third pad pattern PD3 may be disposed between the first pad pattern PD1*c* and the second pad pattern PD2*c* and may be electrically connected to the first and second pad patterns PD1*c* and PD2*c*.

The first pad pattern PD1*c* may be disposed in the same layer as the power line CPT1 and the light shielding pattern CPT2 shown in FIG. 9. The first pad pattern PD1*c* may include the same material as and may be formed through the same process as the power line CPT1 and the light shielding pattern CPT2.

The second pad pattern PD2*c* may be disposed in the same layer as the drain electrode CNE1*a* and the source electrode CNE2*a*. The second pad pattern PD2*c* may include the same material as and may be formed through the same process as the drain electrode CNE1*a* and the source electrode CNE2*a*.

The third pad pattern PD3 may be disposed in the same layer as the gate electrode G1. The third pad pattern PD3 may include the same material as and may be formed through the same process as the gate electrode G1.

The protective layer INSP may cover the second pad pattern PD2*c* and an alignment mark AMb. The protective layer INSP may cover a portion of an upper surface of the second pad pattern PD2*c* and may entirely cover the alignment mark AMb. An opening OPc may be defined through the protective layer INSP to expose the portion of the upper surface of the second pad pattern PD2*c*.

The alignment mark AMb may be disposed in the same layer as the pad pattern PD2*c* spaced farthest from the base substrate BS among the first, second, and third pad patterns PD1*c*, PD2*c*, and PD3. That is, the alignment mark AMb may be disposed in the same layer as the second pad pattern PD2*c* and may include the same material as that of the second pad pattern PD2*c*. That is, the alignment mark AMb may be disposed in the same layer as the drain electrode CNE1*a* and the source electrode CNE2*a*.

It is important to align the position of the connection electrode CTE (refer to FIG. 6) of the circuit film CF (refer to FIG. 6) with the position of the opening OP of the protective layer INSP to allow the circuit film CF to be electrically connected to the pads PD. According to the disclosure, the alignment mark AMb may be formed or disposed in the same layer as the pad pattern PD of the uppermost position. That is, since the pad pattern PD2*c* is formed through the same process as the alignment mark AMb, a position tolerance of the pad pattern PD2*c* may not affect the alignment of the circuit film CF and the display panel DP when the circuit film CF is aligned with the display panel DP (refer to FIG. 3). In detail, since the same position tolerance as the position tolerance of the pad pattern PD2*c* occurs in the alignment mark AMb when the position tolerance of the pad pattern PD2*c* occurs, the position tolerance of the pad pattern PD2*c* may not affect the alignment of the circuit film CF and the display panel DP when the circuit film CF is aligned with the display panel DP with respect to the alignment mark AMb. Accordingly, an alignment tolerance between the connection electrode CTE of the circuit film CF and the opening OPc of the protective layer INSP, which exposes the upper surface of the pad pattern PD2*c*, may be reduced compared to when the alignment mark AM is disposed in a different layer from a layer in which the pad pattern PD2*c* is disposed. That is, an accuracy in alignment between the circuit film CF and the display panel DP may be improved, and thus, a product reliability of the display device DD (refer to FIG. 1) may be improved.

Although the embodiments of the invention have been described, it is understood that the invention should not be limited to these embodiments but various changes and modifications may be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:
1. A display device comprising:
a display panel comprising a display area and a pad area, the display panel comprising:
a base substrate;
a pixel disposed on the base substrate in the display area;

a pad group disposed on the base substrate in the pad area and comprising a plurality of pads arranged in a first direction;

an alignment mark disposed on the base substrate in the pad area and spaced apart from the pad group in the first direction; and a protective layer which covers the plurality of pads and the alignment mark and in which a plurality of openings respectively exposing upper surfaces of the plurality of pads is defined, wherein each of the plurality of pads comprises at least one pad pattern, and the alignment mark is disposed in a same layer as a pad pattern spaced farthest from the base substrate among the at least one pad pattern.

2. The display device of claim 1, wherein the pixel comprises a pixel circuit comprising at least one transistor and a light-emitting element electrically connected to the pixel circuit, and the at least one transistor comprises an active area, a gate electrode, a source electrode, and a drain electrode.

3. The display device of claim 2, wherein the at least one pad pattern comprises a first pad pattern and a second pad pattern disposed on the first pad pattern and electrically connected to the first pad pattern, the alignment mark is disposed in a same layer as the second pad pattern, and the alignment mark comprises a same material as a material of the second pad pattern.

4. The display device of claim 3, further comprising a light shielding pattern disposed between the at least one transistor and the base substrate.

5. The display device of claim 4, wherein the first pad pattern is disposed in a same layer as the light shielding pattern, the second pad pattern is disposed in a same layer as the source electrode and the drain electrode, and the alignment mark is disposed in a same layer as the source electrode and the drain electrode.

6. The display device of claim 4, wherein the at least one pad pattern further comprises a third pad pattern disposed between the first pad pattern and the second pad pattern and electrically connected to the first and second pad patterns.

7. The display device of claim 6, wherein the first pad pattern is disposed in a same layer as the light shielding pattern, the third pad pattern is disposed in a same layer as the gate electrode, and the second pad pattern is disposed in a same layer as the source electrode and the drain electrode, and the alignment mark is disposed in a same layer as the source electrode and the drain electrode.

8. The display device of claim 1, wherein the alignment mark is provided in plural, and alignment marks are spaced apart from each other with the pad group interposed therebetween.

9. The display device of claim 1, wherein the pad group is provided in plural, and pad groups are spaced apart from each other in the first direction.

10. The display device of claim 1, wherein the pad pattern spaced farthest from the base substrate comprises a first conductive layer and a second conductive layer disposed on the first conductive layer, and the second conductive layer comprises indium tin oxide.

11. A display device comprising:
a display panel comprising a display area and a pad area, the display panel comprising:
a base substrate;
a transistor comprising an active area, a gate electrode, a source electrode, and a drain electrode;
a pixel comprising a pixel circuit comprising the transistor and a light-emitting element electrically connected to the pixel circuit;
a light shielding pattern disposed between the transistor and the base substrate;
a pad group disposed on the base substrate in the pad area and comprising a plurality of pads arranged in a first direction;
an alignment mark disposed on the base substrate in the pad area and spaced apart from the pad group in the first direction; and
a protective layer which covers the plurality of pads and the alignment mark and in which a plurality of openings respectively exposing upper surfaces of the plurality of pads is defined, wherein the protective layer is directly in contact with a portion of each of uppermost surfaces of the plurality of pads and an uppermost surface of the alignment mark.

12. The display device of claim 11, wherein each of the plurality of pads comprises a first pad pattern and a second pad pattern disposed on the first pad pattern and electrically connected to the first pad pattern, and the alignment mark is disposed in a same layer as the second pad pattern.

13. The display device of claim 12, wherein the first pad pattern is disposed in a same layer as the light shielding pattern, the second pad pattern is disposed in a same layer as the source electrode and the drain electrode, and the alignment mark is disposed in a same layer as the source electrode and the drain electrode.

14. The display device of claim 12, wherein each of the plurality of pads further comprises a third pad pattern disposed between the first pad pattern and the second pad pattern and electrically connected to the first and second pad patterns,
the first pad pattern is disposed in a same layer as the light shielding pattern, the third pad pattern is disposed in a same layer as the gate electrode, and the second pad pattern is disposed in a same layer as the source electrode and the drain electrode, and the alignment mark is disposed in a same layer as the source electrode and the drain electrode.

* * * * *